US007088585B2

(12) United States Patent
Chu et al.

(10) Patent No.: US 7,088,585 B2
(45) Date of Patent: Aug. 8, 2006

(54) COOLING SYSTEM AND METHOD EMPLOYING AT LEAST TWO MODULAR COOLING UNITS FOR ENSURING COOLING OF MULTIPLE ELECTRONICS SUBSYSTEMS

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US); Takeshi Tsukamoto, Ohtsu (JP)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 10/726,377

(22) Filed: Dec. 3, 2003

(65) Prior Publication Data

US 2005/0122684 A1    Jun. 9, 2005

(51) Int. Cl.
*H05K 7/20* (2006.01)

(52) U.S. Cl. ............... 361/699; 361/701; 62/259.2; 165/104.33

(58) Field of Classification Search ............... 361/689, 361/699, 701, 698; 165/80.4, 104.33; 62/259.2
See application file for complete search history.

(56) References Cited

U.S. PATENT DOCUMENTS

| 4,854,382 A | * | 8/1989 | Funke ............ 165/167 |
| 4,854,726 A |   | 8/1989 | Lesley et al. ......... 374/45 |
| 4,865,123 A | * | 9/1989 | Kawashima et al. ... 165/104.33 |
| 4,873,613 A |   | 10/1989 | Iversen ............ 361/385 |
| 5,144,531 A |   | 9/1992 | Go et al. ............ 361/382 |
| 5,226,471 A | * | 7/1993 | Stefani ............ 165/200 |
| 5,289,363 A |   | 2/1994 | Ferchau et al. ......... 363/141 |

(Continued)

FOREIGN PATENT DOCUMENTS

| GB | 2216997 A | * | 2/1989 |
| JP | 59147989 A | * | 8/1984 |

OTHER PUBLICATIONS

Chu et al., pending U.S. Patent Application, "Scalable Coolant Conditioning Unit with Integral Plate Heat Exchanger/Expansion Tank and Method of Use", filed Sep. 13, 2002, U.S. Appl. No. 10/243,708, 29 pages.

(Continued)

*Primary Examiner*—Lynn Feild
*Assistant Examiner*—Robert J. Hoffberg
(74) *Attorney, Agent, or Firm*—Lily Neff, Esq.; Kevin P. Radigan, Esq.; Heslin Rothenberg Farley & Mesiti, P.C.

(57) ABSTRACT

A cooling system is provided employing at least two modular cooling units (MCUs). Each MCU is capable of providing system coolant to multiple electronics subsystems to be cooled, and each includes a heat exchanger, a first cooling loop with at least one control valve, and a second cooling loop. The first cooling loop receives chilled facility coolant from a source and passes at least a portion thereof through the heat exchanger, with the portion being controlled by the at least one control valve. The second cooling loop provides cooled system coolant to the multiple electronics subsystems, and expels heat in the heat exchanger from the multiple electronics subsystems to the chilled facility coolant in the first cooling loop. The at least one control valve allows regulation of facility coolant flow through the heat exchanger, thereby allowing control of temperature of system coolant in the second cooling loop.

21 Claims, 4 Drawing Sheets

U.S. PATENT DOCUMENTS

| | | | |
|---|---|---|---|
| 5,325,915 A | 7/1994 | Fouts et al. | 165/78 |
| 5,986,882 A | 11/1999 | Ekrot et al. | 361/687 |
| 5,999,404 A | 12/1999 | Hileman | 361/699 |
| 6,035,655 A * | 3/2000 | Hare et al. | 62/259.2 |
| 6,182,742 B1 * | 2/2001 | Takahashi et al. | 165/104.33 |

OTHER PUBLICATIONS

Simons, Robert E., "The Evolution of IBM High Performance Cooling Technology", Dec. 1995, 7 pages, IEEE Transactions on Components, Packaging, and Manufacturing Technology—Part A, vol. 18, No. 4.

* cited by examiner fig. 1 fig. 2 fig. 3 fig. 4

COOLING SYSTEM AND METHOD EMPLOYING AT LEAST TWO MODULAR COOLING UNITS FOR ENSURING COOLING OF MULTIPLE ELECTRONICS SUBSYSTEMS

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Cooling System and Method Employing Multiple Dedicated Coolant Conditioning Units for Cooling Multiple Electronics Subsystems," Chu et al., Ser. No. 10/726,347, filed Dec. 3, 2003; and "Scalable Coolant Conditioning Unit with Integral Plate Heat Exchanger/Expansion Tank and Method of Use," Chu et al., Ser. No. 10/243,708, filed Sep. 13, 2002, which issued on Mar. 30, 2004 as U.S. Pat. No. 6,714,412.

TECHNICAL FIELD

The present invention relates in general to cooling assemblies and other apparatus used for removing heat from electronic devices, modules and systems. More particularly, this invention relates to cooling systems and methods for liquid cooling of electronics subsystems, such as electronics racks, utilizing at least two modular cooling units (MCUs).

BACKGROUND OF THE INVENTION

Heat flux dissipated by electronic equipment, such as microprocessors and power supplies, is again reaching levels that require cooling other than simple air cooling as a means of controlling component temperature. Liquid cooling (e.g., water cooling) is an attractive technology to manage these higher heat fluxes. The liquid absorbs the heat dissipated by the component/modules in an efficient manner, i.e., with minimal temperature rise from the liquid to the component being cooled. Typically, the heat is ultimately transferred from the liquid out into the outside environment. Otherwise, the liquid coolant would continuously rise in temperature.

From the 1970's through the early 1990's, International Business Machines Corporation accomplished this task by circulating cooling liquid via a coolant distribution unit which was a single, large computer room water conditioning unit (CRWCU). The CRWCU distributed conditioned chilled water to the various electronics racks of a mainframe computer system to be cooled. Conventionally, the electronics racks of the mainframe computer included memory frames, processor frames, input/output frames, power frames, etc. Operationally, the CRWCU received customer chilled water which was then used to remove heat from conditioned cooled water to the individual electronics racks of the computer room.

The CRWCU included a primary cooling loop wherein building chilled water was supplied and passed through a control valve driven by a motor. The valve determined an amount of building chilled water to be passed through a heat exchanger, with a portion of the building chilled water possibly being returned directly to the return via a bypass orifice. The CRWCU further included a second cooling loop with a reservoir tank from which water was pumped either by one of two pumps into the heat exchanger for conditioning and output therefrom as a conditioned water source to the electronics racks to be cooled within the computer room. The computer room water conditioning unit normally stood separate from the electronics frames, and again, would supply system water (typically maintained at about 22° C.) to all electronics frames of the computer room.

The coolant distribution unit, and more particularly, the computer room water conditioning unit (CRWCU), contained a single heat exchanger, a single reservoir, a single control valve, and redundant pumps. Thus, in the case of a failed pump, the CRWCU would automatically switch to the redundant pump, but any other malfunction in the coolant distribution unit would have brought down the whole computer room mainframe system. For example, if the heat exchanger, or control valve, or building chilled water source failed, the entire mainframe system in the computer room would also fail. Redundant mainframe computers would have been on the computer room floor to allow continuation of processing (in a degraded mode) until the downed mainframe could be repaired.

SUMMARY OF THE INVENTION

Today, a multi-frame mainframe system such as existed in the 1970's and 1980's has been replaced with single processor frames or racks. Thus, multiple processor frames, from high end, mid-range and low end could now be sourced from a single computer room water conditioning unit. Therein lies a problem, however. A single heat exchanger failure or control valve failure or loss of chilled water source could bring down the entire computer room floor.

These shortcomings are overcome and additional advantages are provided through the provision of a cooling system having at least two modular cooling units (MCUs), wherein each MCU is capable of providing system coolant to multiple electronics subsystems to be cooled. Each MCU comprises a heat exchanger, a first cooling loop with at least one control valve, and a second cooling loop. When an MCU is operational, the first cooling loop receives chilled facility coolant from a source and passes at least a portion thereof through the heat exchanger, with the portion being controlled by the at least one control valve. The second cooling loop provides cooled system coolant to the multiple electronics subsystems, and expels heat in the heat exchanger from the multiple electronics subsystems to the chilled facility coolant in the first cooling loop. The at least one control valve allows regulation of chilled facility coolant flow through the heat exchanger, thereby allowing control of a desired temperature of the system coolant in the second cooling loop for cooling the multiple electronics subsystems.

In another aspect, a cooled electronics system is provided. The cooled electronics system includes multiple electronics subsystems, and at least two modular cooling units (MCUs). Each MCU is capable of providing system coolant to the multiple electronics subsystems to be cooled. Each MCU includes a heat exchanger, a first cooling loop with at least one control valve, and a second cooling loop. When the MCU is operational, the first cooling loop receives chilled facility coolant from a source and passes at least a portion thereof through the heat exchanger, with the portion being controlled by the at least one control valve. The second cooling loop provides cooled system coolant to the multiple electronics subsystems, and expels heat in the heat exchanger from the multiple electronics subsystems to the chilled facility coolant in the first cooling loop. The at least one control valve allows regulation of the chilled facility coolant flow through the heat exchanger, and thus, allows control of temperature of the system coolant in the second cooling loop for cooling the multiple electronics subsystems.

In a further aspect, a method for cooling multiple electronics subsystems is provided. The method includes providing at least two modular cooling units (MCUs), wherein each MCU is capable of providing system coolant to the multiple electronics subsystems to be cooled. Further, each MCU comprises a heat exchanger, a first cooling loop with at least one control valve, and a second cooling loop with system coolant. The method further includes, for a selected MCU of the at least two MCUs: providing chilled facility coolant to the first cooling loop from a source and passing at least a portion thereof via the at least one control valve through the heat exchanger; providing cooled system coolant from the second cooling loop to the multiple electronics subsystems, and expelling heat in the heat exchanger from the multiple electronics subsystems to the chilled facility coolant in the first cooling loop, wherein the at least one control valve of the selected MCU allows regulation of facility coolant flow through the heat exchanger, thereby allowing control of temperature of the system coolant in the second cooling loop for cooling the multiple electronics subsystems.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics subsystem" comprises any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one embodiment, an electronics rack may comprise multiple electronics drawers, each having one or more heat generating components requiring cooling.

One example of coolant within the coolant distribution unit, or more particularly within the modular cooling units (MCUs) described herein, is water. However, the concepts disclosed are readily adapted to use with other types of coolant on both the facility side and the system side. For example, the coolant may comprise a brine, a fluorocarbon liquid, or other similar chemical coolant or a refrigerant, while still maintaining the advantages and unique features of the present invention.

As noted briefly above, power levels in computer equipment (primarily processors) have again risen to a level where they no longer can be simply air cooled. The components will likely be water cooled. Heat dissipated by the processor can be transferred to the water via a water cooled cold plate. Water typically available at customer locations (i.e., data centers) is not suitable for use in these cold plates. First, condensation formation is a concern as the temperature of the data center water, ranging from 7° C. to 15° C., is far below the room dew point (typically 18–23° C.). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat from the data center water. As used herein, "facility water" or "facility coolant" refers to this data center water or coolant, while "system water" or "system coolant" refers to the cooled/conditioned water or coolant, respectively, circulating between the coolant distribution unit and the electronics subsystem(s) being cooled.

Figure 1:
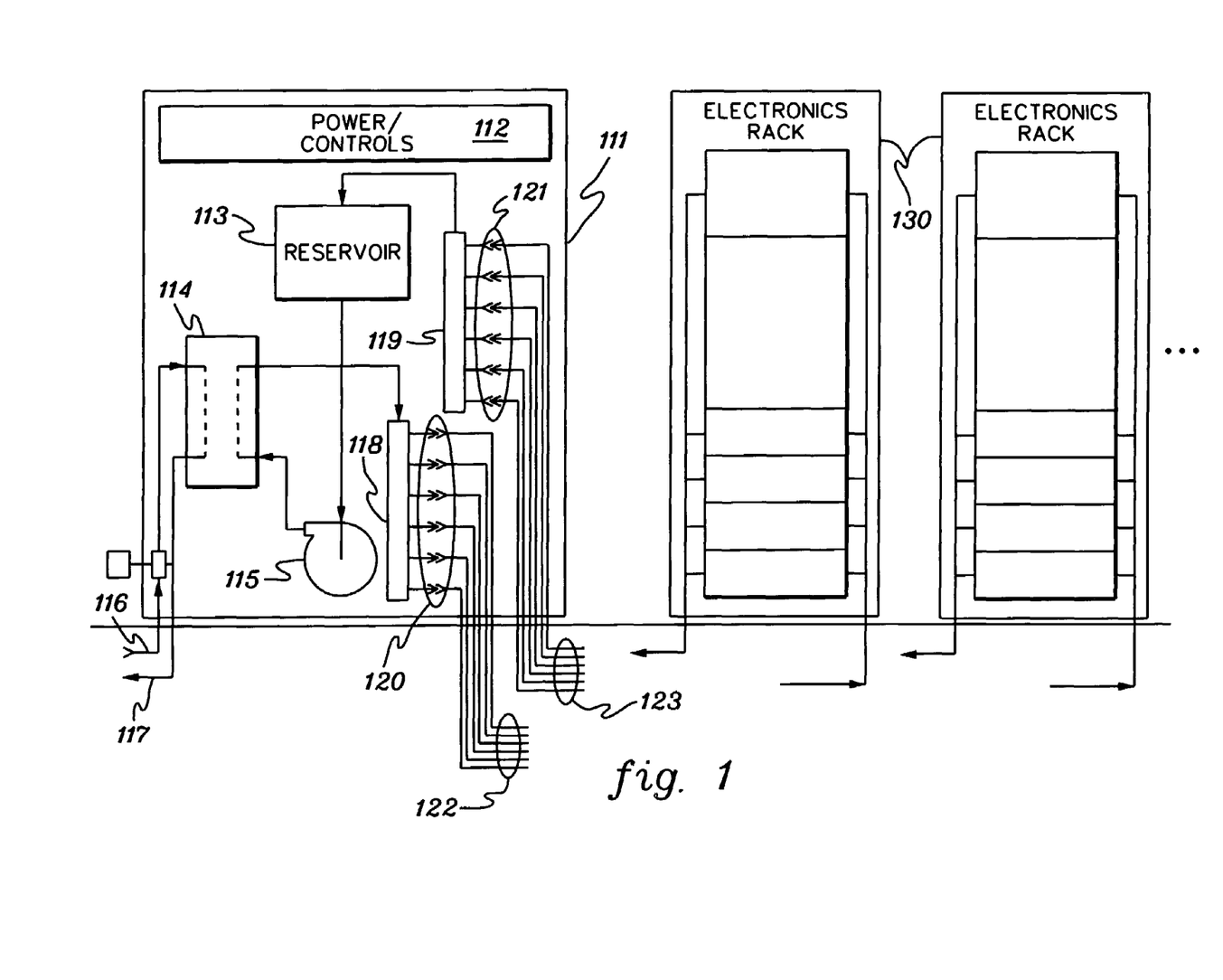
FIG. 1 depicts a conventional coolant distribution unit for a computer room.

Reference is now made to the drawings, wherein the same reference numbers used throughout different figures designate the same or similar components. FIG. 1 depicts one embodiment of a conventional coolant distribution unit for a computer room. The cooling unit 111 was relatively large and occupied more than what would now be considered as two full electronics frames. Within the cooling unit was a power/control element 112, a reservoir/expansion tank 113, a heat exchanger 114, a pump 115 (often accompanied by a redundant second pump), customer water (or site or facility service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121.

Figure 2:
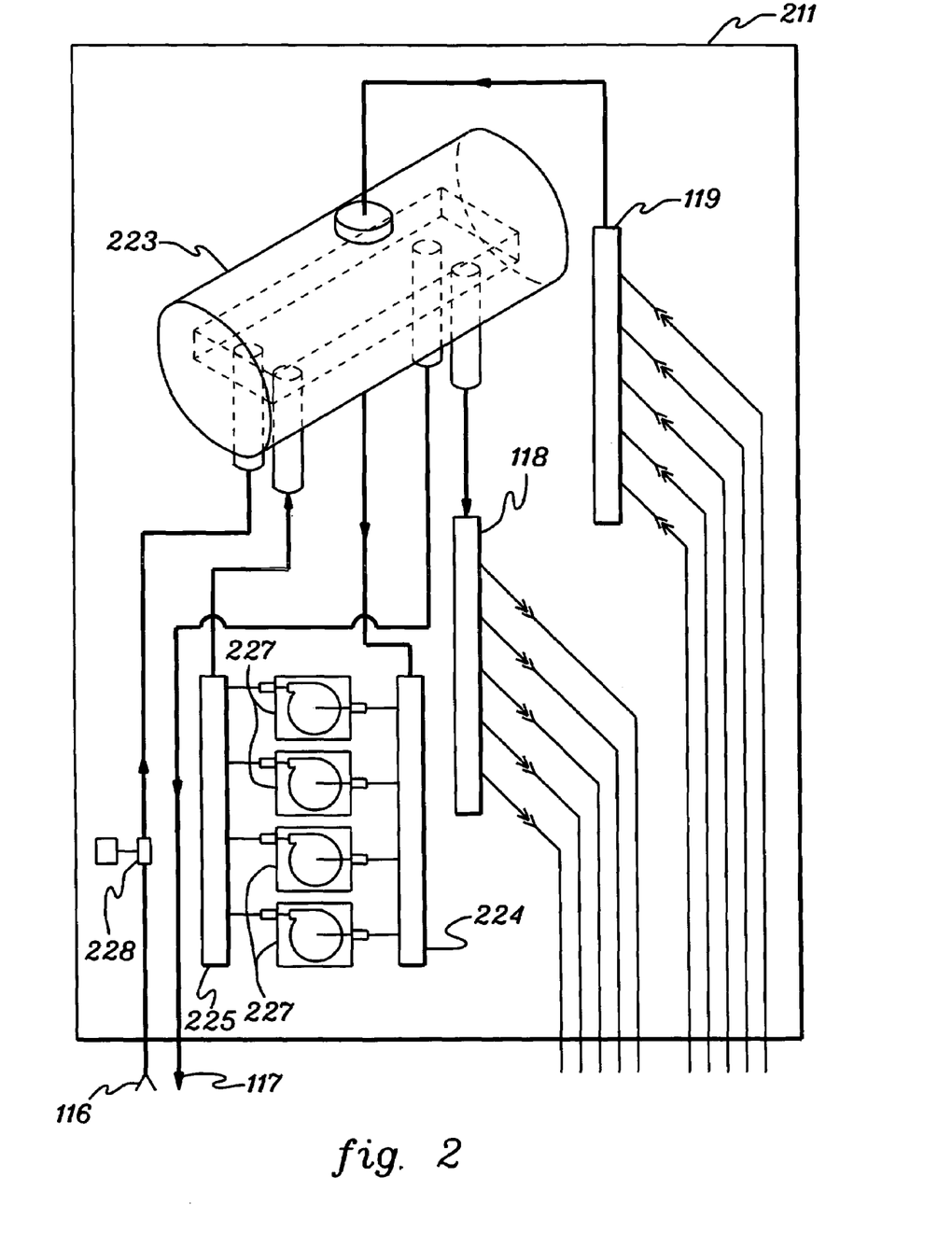
FIG. 2 is a schematic of a scalable coolant conditioning unit, which can be employed in accordance with an aspect of the present invention.

FIG. 2 illustrates one embodiment of a scalable coolant conditioning unit (SCCU) 211, in accordance with an aspect of the present invention. Within unit 211 would be a power regulator and controller (not shown). System coolant returning from the electronics racks is collected in a return manifold 119 and directed through the expansion tank section of an integral heat exchanger/expansion tank 223, as described in detail in the above-incorporated U.S. patent application titled "Scalable Coolant Conditioning Unit with Integral Plate Heat Exchanger/Expansion Tank and Method of Use." From expansion tank 223, system coolant is directed to another manifold 224 which supplies coolant to multiple modular pumping units (MPUs) 227. The higher pressure discharge of the MPUs is collected in a manifold 225 and directed to the "hotside" of the heat exchanger within the integral heat exchanger/expansion tank 223. The MPUs are connected to the manifolds via an insertion facilitation mechanism comprising automatic coupling assemblies (not shown), which are connected via flexible hoses to an isolation valve mechanism comprising a plurality of solenoid operated isolation valves. Alternatively, the isolation valves could be manually operated either locally or remotely, and the automatic coupling assemblies could be replaced by manually operated quick disconnects. The isolation valves are connected to manifolds 224 and 225 for isolating the MPUs from the manifolds during installation and removal.

Having been cooled by the facility chilled water flowing through the "coldside" of the heat exchanger (116, 117), the system coolant is sent to the supply manifold 118 which distributes the coolant to the one or more electronics racks requiring cooling. Although not shown here, the SCCU could also incorporate means to filter the system water and automatically add a corrosion inhibitor such as benzotriazole (BTA) as needed. A two-way control valve 228 is used to regulate the flow rate of the facility chilled water to the heat exchanger within the integral heat exchanger/expansion tank 223, thereby controlling the temperature of system coolant delivered to the electronics racks. A thermistor temperature sensing element (not shown) can be located at the inlet of the system coolant supply manifold 118 to supply an electronic signal to the power/controller controlling operation of valve 228. If the system coolant temperature is higher than desired, valve 228 can be opened more allowing an increased flow of facility water through the heat exchanger resulting in a decrease of the temperature of the system water directed to the electronics racks from supply manifold 118. Alternatively, if the system water temperature is lower than desired, valve 228 can be closed more providing a decreased flow of facility water through the heat exchanger, resulting in an increase in the temperature of the system water directed to the electronics racks from supply manifold 118. Note from FIG. 2 that the function of the coolant distribution unit is scalable by adding modular pumping units to the SCCU as needed depending upon the cooling requirements of the computer room electronics subsystems.

Computer systems today are being designed and built for continuous operation. This can be accomplished through a combination of redundant components that are concurrently maintainable, and that can be replaced without affecting system operation. Examples include multiple fans/blowers or multiple power supply modules. Neither the original coolant distribution unit of FIG. 1, or the enhanced scalable coolant conditioning unit of FIG. 2, have the necessary level of redundancy or concurrent maintenance capability to provide the required system available. Therefore, provided herein is a cooling system and method which employs at least two modular cooling units (MCUs), each of which matches or exceeds the cooling requirements of the computer room electronics subsystems to be cooled. Further, each MCU matches or exceeds the availability of the electronics subsystems themselves through a combination of modular redundancy coupled with concurrent maintenance capability.

Figure 3:
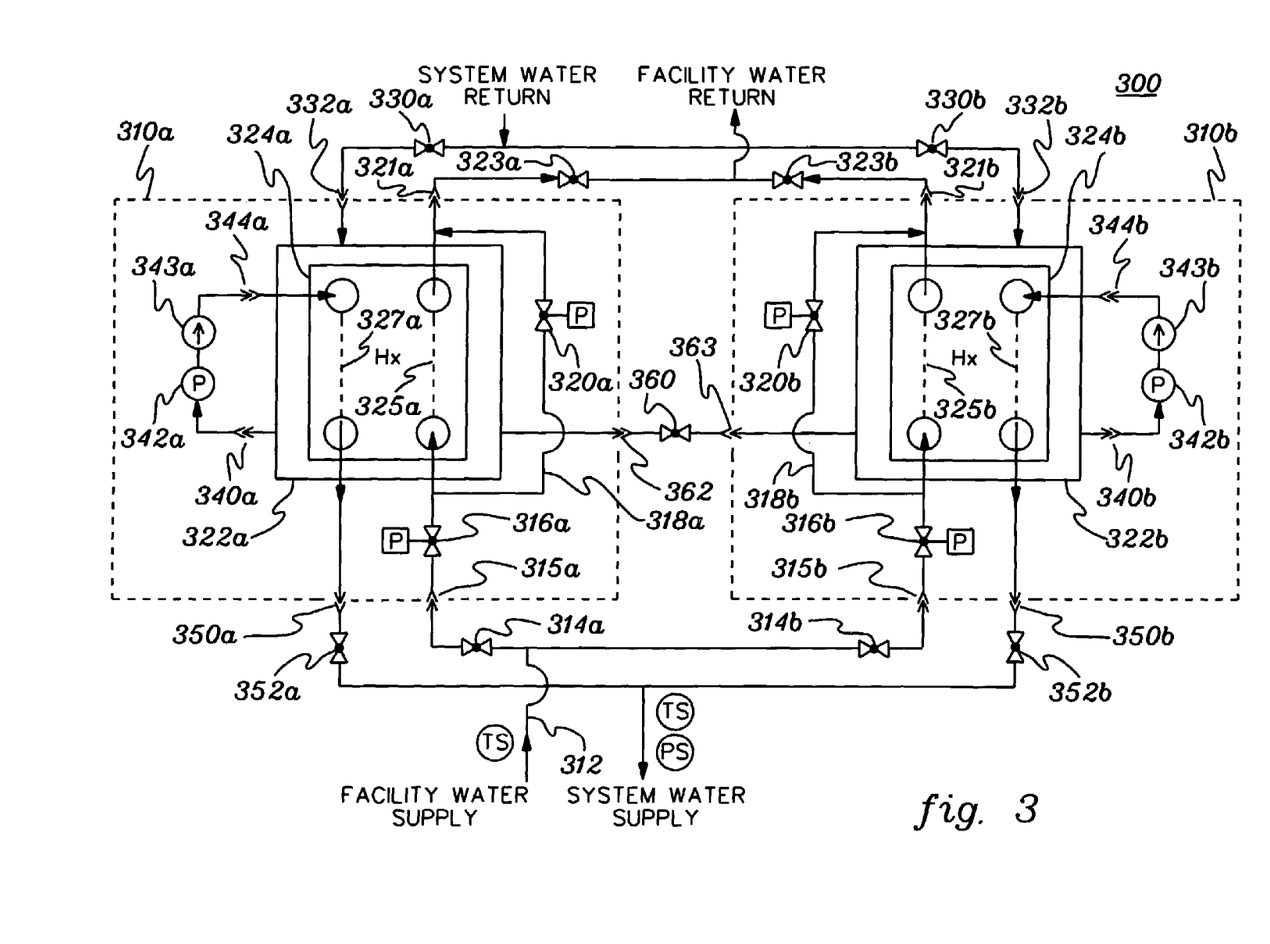
FIG. 3 depicts one partial embodiment of a cooling system employing two modular cooling units, in accordance with an aspect of the present invention.

FIG. 3 depicts one partial embodiment of a cooling system or coolant distribution unit 300 in accordance with an aspect of the present invention. In this example, unit 300 includes at least two modular cooling units (MCUs) 310a, 310b. Each cooling unit 310a, 310b is capable of providing system coolant to multiple electronics subsystems or electronics racks to be cooled. An inlet line 312 couples facility water supply from a source into the cooling system. Facility water is directed to the MCUs through two-way manual ball valves 314a, 314b, which are normally open unless one of the MCUs are being replaced or removed for repair. Ferrule couplings 315a and 315b are also positioned on the facility coolant supply inlet to facilitate removal of an MCU if necessary. Electrically operated two-way proportional valves 316a, 316b determine whether facility coolant flows through MCU 310a or MCU 310b under control of the system controller.

A bypass 318a, 318b is provided to shunt a portion of the facility coolant around the integral expansion tank/heat exchanger of this embodiment. The amount of facility coolant through the bypass 318a, 318b is controlled by the controller using electrically operated two way proportional valves 320a, 320b. Facility coolant passing into the expansion tank 322a, 322b proceeds through a first cooling loop 325a, 325b within the heat exchanger (Hx) 324a, 324b. After exiting the first cooling loop, facility water passes through another ferrule coupling 321a, 321b and two way manual ball valve 323a, 323b before returning to the source of the facility water.

On the system water side, system water returns from the multiple electronics subsystems and passes through ball valves 330a, 330b and ferrule couplings 332a, 332b, where it is added to the system coolant in the expansion tank 322a, 322b. System coolant from the tank is then drawn through a ferrule coupling 340a, 340b and pressurized by a pump 342a, 342b, which returns the pressurized system coolant through a check valve 343a, 343b and ferrule coupling 344a, 344b to the second cooling loop 327a, 327b of the heat exchanger 324a, 324b. From the second cooling loop, cooled system water is forwarded to an appropriate electronics rack manifold via for example, ferrule couplings 350a, 350b and ball valves 352a, 352b. If desired, temperature sensors "TS" could be provided on both the facility water inlet supply line and system water outlet supply line, and a pressure sensor "PS" could be disposed on the system water outlet supply line to monitor operational conditions within the cooling system.

The reservoirs or expansion tanks 322a, 322b of the MCUs 310a, 310b are in fluid communication through ball valve 360, which again has ferrule couplings 362, 363 on either side thereof. Valve 360 and couplings 362, 363 allow for the removal of or replacement of one of the modular cooling units.

Advantageously, there are a minimum of two modular cooling units in each cooling system such as depicted in FIG. 3. These cooling units are tied together through the ball valves and couplings discussed above so that either MCU can be operating at a given time. As noted, each MCU is configured to provide the entire cooling system capability for the one or more electronics subsystems to be cooled. Although shown as the integral heat exchanger/expansion tank of FIG. 2, each modular cooling unit could be configured with a separate expansion tank and heat exchanger. Further, each heat exchanger can be one of various embodiments, including a plate heat exchanger or shell-and-tube heat exchanger. The MCUs are tied together through manifolding so that either MCU can be operating at a given time. Operation of and switching between the MCUs can be microcode controlled through a power and controller subsystem of the cooling system. Ferrule couplings exist at piping connections into/out of each MCU so that an MCU can be removed and replaced if necessary. Manual isolation valves are associated with each ferrule coupling so that an operating MCU can be isolated or decoupled from an idle MCU. Additional ferrule couplings are provided for the pump within each MCU so that the pump can be replaced without having to remove the entire MCU. A further feature of the design of FIG. 3 is piping that connects the two reservoirs. During normal operating conditions, there is no assurance that system water will flow into one expansion tank or the other. Problems are thus avoided by coupling these expansion tanks together as shown in FIG. 3.

Figure 4:
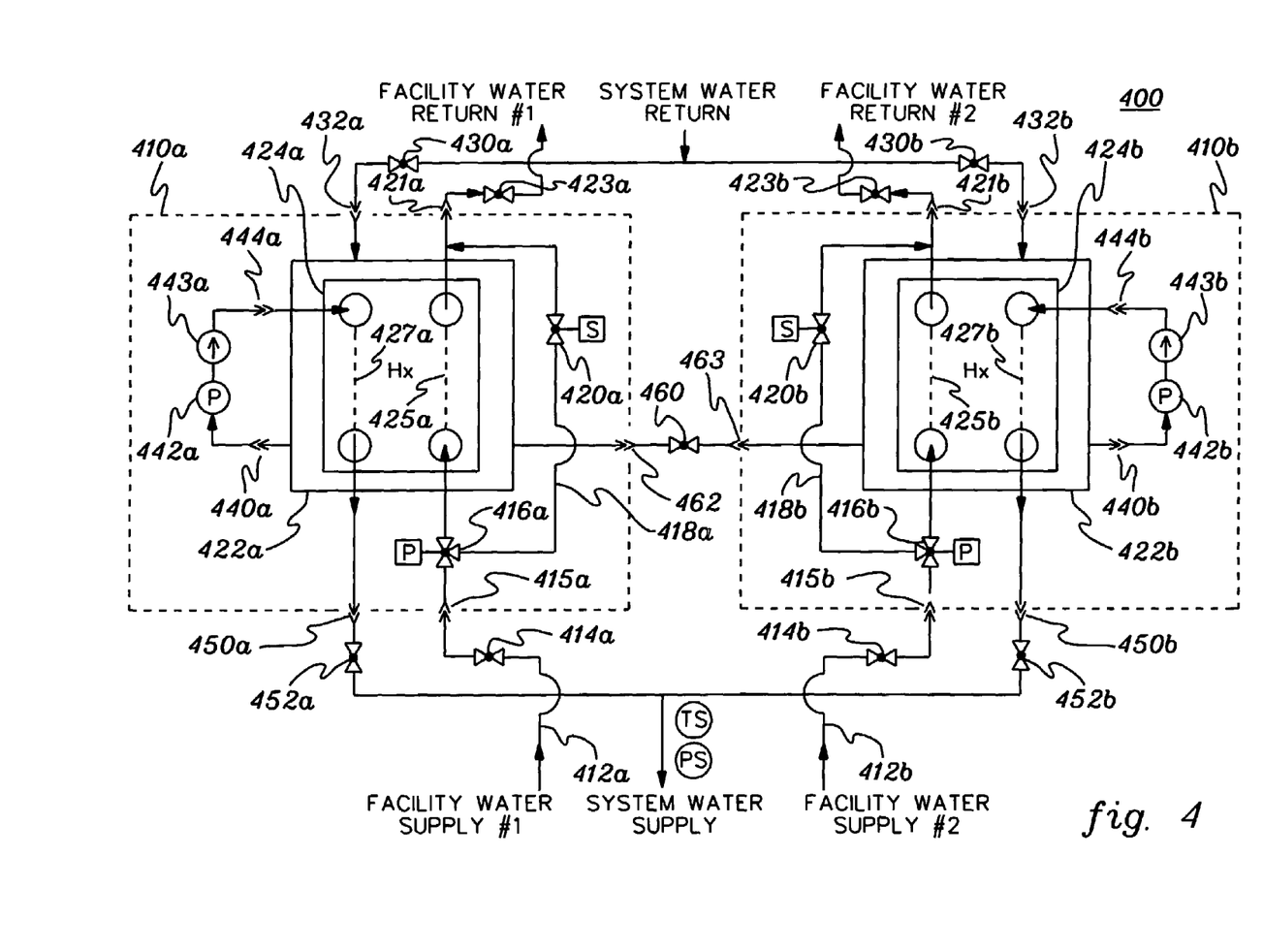
FIG. 4 depicts an alternate, partial embodiment of a cooling system employing at least two modular cooling units, in accordance with an aspect of the present invention.

FIG. 4 depicts a partial embodiment of an alternate cooling system or coolant distribution unit implementation 400, which again employs at least two modular cooling units 410a, 410b. In this alternative implementation, the customer water paths are separated and isolated so that facility water is received via a first input line 412a, and a second input line 412b, and is returned via a first return line and a second return line, respectively. Added availability can be realized if the two facility water feeds are truly redundant and independent of one another. This assures there will be a facility water supply available to cool the operating electronics subsystems.

In operation, the facility water supply flows through a two way manual ball valve 414a, 414b, which again, is normally open. The facility water is provided via ferrule couplings 415a, 415b to an electrically operated three-way proportional valve 416a, 416b. Valve 416a, 416b determines an amount of facility water to be shunted around the expansion tank 422a, 422b, with the integral heat exchanger 424a, 424b. Facility water flow through the bypass is controlled by an electrically operated shutoff valve 420a, 420b. (For example, valves 420a, 420b can shutdown the bypass flow in a non-operating MCU to prevent facility water flow through the non-operating MCU.) As explained above, temperature of system coolant in the second cooling loop 427a, 427b can be controlled by controlling the amount of chilled facility water flowing through the first cooling loop 425a, 425b. This can be achieved by controlling the amount of facility water passing through the respective bypass. After passing through the heat exchanger, the facility water is output through a ferrule coupling 421a, 421b and ball valve 423a, 423b for return to the respective independent source.

On the system water side, returning system water is collected in a return manifold and forwarded to an operating one of the conditioning units 410a, 410b via a two way ball valve 430a and 430b and an associated ferrule coupling 432a, 432b. The returning system water flows into the expansion tank 422a, 422b. Simultaneously, water is withdrawn from the tank via a pump 422a, 422b across an associated ferrule coupling 440a, 440b. The system water is pressurized by pump 442a, 442b, passed through a check valve 443a, 443b and an associated ferrule coupling 444a, 444b, and input to the second cooling loop 427a, 427b, where the system water is cooled within the heat exchanger 424a, 424b. Cooled system coolant output from the heat exchanger passes through an associated ferrule coupling 450a, 450b and ball valve 452a, 452b, where it is provided to the one or more electronics subsystems to be cooled. Also, shown in FIG. 4 are temperature sensor "TS" and pressure sensor "PS" on the system water supply line, which can be used to monitor operation of the cooling system. The expansion tanks are also again in communication via a ball valve 460 having associated ferrule couplings 462, 463.

Although preferred embodiments have been depicted and described in detail herein, it will be apparent to those skilled in the relevant art the various modifications, additions, substitutions and the like can be made without departing from the spirit of the invention and these are therefore considered to be within the scope of the invention as defined in the following claims.

What is claimed is:

1. A cooling system comprising:
   at least two modular cooling units (MCUs), each MCU being capable of providing system coolant to multiple electronics subsystems to be cooled;
   wherein each MCU of the at least two MCUs comprises a heat exchanger, a first cooling loop with at least one control valve, and a second cooling loop, and wherein when an MCU of the at least two MCUs is operational, the first cooling loop receives chilled facility coolant from a source and passes at least a portion thereof through the heat exchanger, the portion being controlled by the at least one control valve, and the second cooling loop provides cooled system coolant to the multiple electronics subsystems, and expels heat in the heat exchanger from the multiple electronics subsystems to the chilled facility coolant in the first cooling loop, wherein the at least one control valve allows regulation of facility coolant flow through the heat exchanger, thereby allowing control of a desired temperature of system coolant in the second cooling loop for cooling the multiple electronics subsystems; and
   wherein when the cooling system is operational, only one MCU of the at least two MCUs is operating to provide system coolant to the multiple electronic subsystems, with at least one other MCU of the at least two MCUs being in a standby mode, and wherein the cooling system further comprises couplings associated with the at least two MCUs which allow each MCU to be removed while another MCU of the at least two MCUs is operational and providing system coolant to the multiple electronics subsystems, and each MCU further comprises a system coolant expansion tank in communication with the second cooling loop, and wherein the system coolant expansion tanks of the at least two MCUs are connected in fluid communication to ensure that sufficient system coolant remains in the system coolant expansion tank of an operating MCU.

2. The cooling system of claim 1, wherein each MCU comprises a pump for moving system coolant through the second cooling loop, and couplings on either side of the pump to allow for removal of the pump without requiring removal of the MCU.

3. The cooling system of claim 1, wherein the source of chilled facility coolant comprises a common source of chilled facility coolant supplied to the at least two MCUs.

4. The cooling system of claim 1, wherein the source of chilled facility coolant comprises a first source having a first input line and a first return line coupled to a first MCU of the at least two MCUs, and a second source having a second input line and a second return line coupled to a second MCU of the at least two MCUs.

5. The cooling system of claim 1, wherein the multiple electronics subsystems comprise multiple electronics racks comprising a computer room computing environment, wherein each MCU is capable of providing system coolant to cool the computer room computing environment.

6. The cooling system of claim 1, further comprising a controller for monitoring operation of the at least two MCUs and upon detection of a failure in one MCU of the at least two MCUs, for automatically switching to another MCU of the at least two MCUs to ensure continued cooling of the multiple electronics subsystems.

7. The cooling system of claim 6, further comprising electrically controllable shutoff valves coupled to each MCU and controllable by the controller for selectively directing chilled facility coolant flow through one of the MCUs of the at least two MCUs and for selectively directing system coolant from one of the MCUs of the at least two MCUs to the multiple electronics subsystems.

8. A cooling system comprising:
   at least two modular cooling units (MCUs), each MCU being capable of providing system coolant to multiple electronics subsystems to be cooled;

wherein each MCU of the at least two MCUs comprises a heat exchanger, a first cooling loop with at least one control valve, and a second cooling loop, and wherein when an MCU of the at least two MCUs is operational, the first cooling loop receives chilled facility coolant from a source and passes at least a portion thereof through the heat exchanger, the portion being controlled by the at least one control valve, and the second cooling loop provides cooled system coolant to the multiple electronics subsystems, and expels heat in the heat exchanger from the multiple electronics subsystems to the chilled facility coolant in the first cooling loop, wherein the at least one control valve allows regulation of facility coolant flow through the heat exchanger, thereby allowing control of a desired temperature of system coolant in the second cooling loop for cooling the multiple electronics subsystems; and wherein each MCU further comprises a system coolant expansion tank, and wherein the heat exchanger of each MCU is disposed within the MCU's system coolant expansion tank.

9. The cooling system of claim 8, wherein the heat exchanger of each MCU comprises a plate heat exchanger integrally disposed within the system coolant expansion tank.

10. A cooled electronics system comprising:

multiple electronics subsystems;

at least two modular cooling units (MCUs), each MCU being capable of providing system coolant to the multiple electronics subsystems to be cooled;

wherein each MCU of the at least two MCUs comprises a heat exchanger, a first cooling loop with at least one control valve, and a second cooling loop, and wherein when the MCU is operational, the first cooling loop receives chilled facility coolant from a source and passes at least a portion thereof through the heat exchanger, the portion being controlled by the at least one control valve, and the second cooling loop provides cooled system coolant to the multiple electronics subsystems, and expels heat in the heat exchanger from the electronics subsystems to the chilled facility coolant in the first cooling loop, wherein the at least one control valve allows regulation of facility coolant flow through the heat exchanger, thereby allowing control of temperature of system coolant in the second cooling loop for cooling the multiple electronics subsystems; and wherein when the cooled electronics system is operational, only one MCU of the at least two MCUs is operating to provide system coolant to the multiple electronics subsystems, and wherein the cooled electronics system comprises couplings associated with the at least two MCUs which allow each MCU to be removed while another MCU of the at least two MCUs is operational and providing system coolant to the multiple electronics subsystems, and wherein each MCU further comprises a system coolant expansion tank in communication with the second cooling loop, and wherein the system coolant expansion tanks of the at least two MCUs are connected in fluid communication to ensure that sufficient system coolant remains in the system coolant expansion tank of an operating MCU.

11. The cooled electronics system of claim 10, wherein each MCU comprises a pump for moving system coolant through the second cooling loop, and couplings on either side of the pump for allowing removal of the pump without requiring removal of the MCU.

12. The cooled electronics system of claim 10, wherein the source of chilled facility coolant comprises a first source having a first input line and a first return line coupled to a first MCU of the at least two MCUs, and a second source having a second input line and a second return line coupled to a second MCU of the at least two MCUs.

13. The cooled electronics system of claim 10, wherein the multiple electronics subsystems comprise multiple electronics racks which together comprise a computer room computing environment, wherein each MCU of the at least two MCUs is capable of providing system coolant to cool the computer room computing environment.

14. The cooled electronics system of claim 10, further comprising a controller for monitoring the at least two MCUs and upon detection of a failure in one MCU of the at least two MCUs, for automatically switching to another MCU of the at least two MCUs to ensure continued cooling of the multiple electronics systems.

15. The cooled electronics system of claim 14, further comprising electrically controllable shutoff valves coupled to each MCU and controllable by the controller for selectively directing chilled facility coolant through one of the MCUs of the at least two MCUs and for selectively directing system coolant from one of the MCUs of the at least two MCUs to the multiple electronics subsystems.

16. A cooled electronics system comprising:

multiple electronics subsystems;

at least two modular cooling units (MCUs), each MCU being capable of providing system coolant to the multiple electronics subsystems to be cooled;

wherein each MCU of the at least two MCUs comprises a heat exchanger, a first cooling loop with at least one control valve, and a second cooling loop, and wherein when the MCU is operational, the first cooling loop receives chilled facility coolant from a source and passes at least a portion thereof through the heat exchanger, the portion being controlled by the at least one control valve, and the second cooling loop provides cooled system coolant to the multiple electronics subsystems, and expels heat in the heat exchanger from the electronics subsystems to the chilled facility coolant in the first cooling loop, wherein the at least one control valve allows regulation of facility coolant flow through the heat exchanger, thereby allowing control of temperature of system coolant in the second cooling loop for cooling the multiple electronics subsystems; and wherein each MCU further comprises a system coolant expansion tank, and wherein the heat exchanger of each MCU is disposed within the MCU's system coolant expansion tank.

17. The cooled electronics system of claim 16, wherein the heat exchanger of each MCU comprises a plate heat exchanger integrally disposed within the system coolant expansion tank.

18. A method for cooling multiple electronics subsystems, the method comprising:

providing at least two modular cooling units (MCUs), each MCU being capable of providing system coolant to multiple electronics subsystems to be cooled, wherein each MCU of the at least two MCUs comprises a heat exchanger, a first cooling loop with at least one control valve, and a second cooling loop with system coolant;

providing, for a selected MCU of the at least two MCUs, chilled facility coolant to the first cooling loop from a source and passing at least a portion thereof via the at least one control valve through the heat exchanger;

providing, for the selected MCU of the at least two MCUs, cooled system coolant from the second cooling loop to the multiple electronics subsystems, and expelling heat in the heat exchanger from the multiple electronics subsystems to the chilled facility coolant in the first cooling loop;

wherein the at least one control valve of the selected MCU allows regulation of facility coolant flow through the heat exchanger, thereby allowing control of temperature of the system coolant in the second cooling loop for cooling the multiple electronics subsystems; and further comprising:

cooling the multiple electronics subsystems employing only one MCU of the at least two MCUs, with the other MCU of the at least two MCUs being in a standby mode;

providing couplings associated with the at least two MCUs which allow each MCU to be removed while the other MCU of the at least two MCUs is operational and providing system coolant to the multiple electronics subsystems; and providing, for each MCU of the at least two MCUs, a system cooling expansion tank in communication with the second cooling loop, and wherein the system cooling expansion tanks of the at least two MCUs are connected in fluid communication to ensure that sufficient system coolant remains in the system coolant expansion tank of an operating MCU.

19. The method of claim 18, wherein the source of chilled facility coolant comprises a first source having a first input line and a first return line coupled to a first MCU of the at least two MCUs, and a second source having a second input line and a second return line coupled to a second MCU of the at least two MCUs, and wherein the method further comprises automatically switching operation between the first MCU and the second MCU upon detection of a leak in an input line or a return line.

20. The method of claim 18, wherein the multiple electronics subsystems comprise multiple electronics racks comprising a computer room computing environment, and wherein the method further comprises providing system coolant to cool the computer room computing environment from only one MCU of the at least two MCUs at a time.

21. The method of claim 18, further comprising monitoring operation of the at least two MCUs, and upon detection of a failure in one operating MCU of the at least two MCUs, automatically switching to another MCU of the at least two MCUs to ensure continued cooling of the multiple electronics subsystems.

* * * * *